US 6,664,809 B1

(12) United States Patent
Chiu (10) Patent No.: US 6,664,809 B1
(45) Date of Patent: Dec. 16, 2003

(54) METHOD AND SYSTEM FOR A CMOS LEVEL SHIFTER CIRCUIT FOR CONVERTING A LOW VOLTAGE INPUT TO A VERY HIGH-VOLTAGE OUTPUT

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 18 days.

(21) Appl. No.: 09/930,100

(22) Filed: Aug. 14, 2001

(51) Int. Cl.[7] .......................................... H03K 19/0948
(52) U.S. Cl. .............................. 326/81; 326/80; 326/68
(58) Field of Search .............................. 326/68, 63, 80, 326/81; 327/333

(56) References Cited

U.S. PATENT DOCUMENTS 5,357,156 A * 10/1994 Herrington .................. 327/103
5,410,267 A * 4/1995 Haycock et al. ............... 326/81
5,995,010 A * 11/1999 Blake et al. ................. 340/653

* cited by examiner

Primary Examiner—Anh Tran (57) ABSTRACT

A level shifter circuit for accepting low voltage inputs and providing high voltage outputs corresponding thereto. The level shifter circuit uses a reference voltage source configured to produce an intermediate voltage with respect to ground and a high voltage source. A first output transistor and a second output transistor are used for producing a high voltage swing output signal by using a high voltage source. Source follower transistors are used to switch on and switch off the first and second output transistors by using the intermediate voltage. The source follower transistors are configured to ensure the maximum voltage seen across the gates of the first and second output transistors is limited to a difference between the intermediate voltage and the high voltage source. A differential input buffer can be used for controlling the source follower transistors in accordance with a low voltage differential input. The differential input buffer is configured to control the source follower transistors without requiring a standby current. The components of the level shifter circuit are compatible with widely used CMOS fabrication processes. The level shifter circuit thus comprises a compact, low component count circuit which can shift low voltage digital logic inputs to high voltage outputs.

18 Claims, 7 Drawing Sheets

METHOD AND SYSTEM FOR A CMOS LEVEL SHIFTER CIRCUIT FOR CONVERTING A LOW VOLTAGE INPUT TO A VERY HIGH-VOLTAGE OUTPUT

TECHNICAL FIELD

The present invention relates to the field of low voltage digital electronic integrated circuits. More particularly, the present invention relates to a level shifter for converting low voltage digital electronic logic to high voltage output.

BACKGROUND ART

Within the communications industry, there is an ever increasing need for lower power consumption and higher switching rates. For example, microprocessor designs are continuously decreasing their die size, and accordingly reducing the power consumption while increasing their performance. Application-specific integrated circuit (ASIC) designs are similarly decreasing their die size, reducing power consumption, and the like. These digital electronic circuits are being used to control many different types of electronic devices. The digital electronic circuits are being used to control functionality of these other devices, thereby imparting sophisticated behavior and complex functions to the devices.

Electronically controlled devices require a means of interfacing with the digital electronic circuits which control them. For example, powerful robotic machine tools require precise electronic interfaces to the digital electronic control modules which control their movement and function. Computer-controlled cathode ray tubes (CRTs) require interfaces to the digital electronics which control the operation of the magnetic components and electron beam components within the tube.

As described above, the digital electronics (e.g., microprocessors, ASICs, etc.) which comprise the controllers for the above types of devices are becoming increasingly integrated and are using lower and lower operating voltages (e.g., 3.3 V or less). However, the devices to which the electronics are interfaced tend to use much higher voltages in their operation. Thus, specialized integrated circuits for converting the low voltage digital electronic logic levels to the high voltage outputs required by external devices have been developed. Such circuits are often referred to as level shifters, since they function by shifting low voltage level logic to corresponding high voltage level output.

Figure 1:
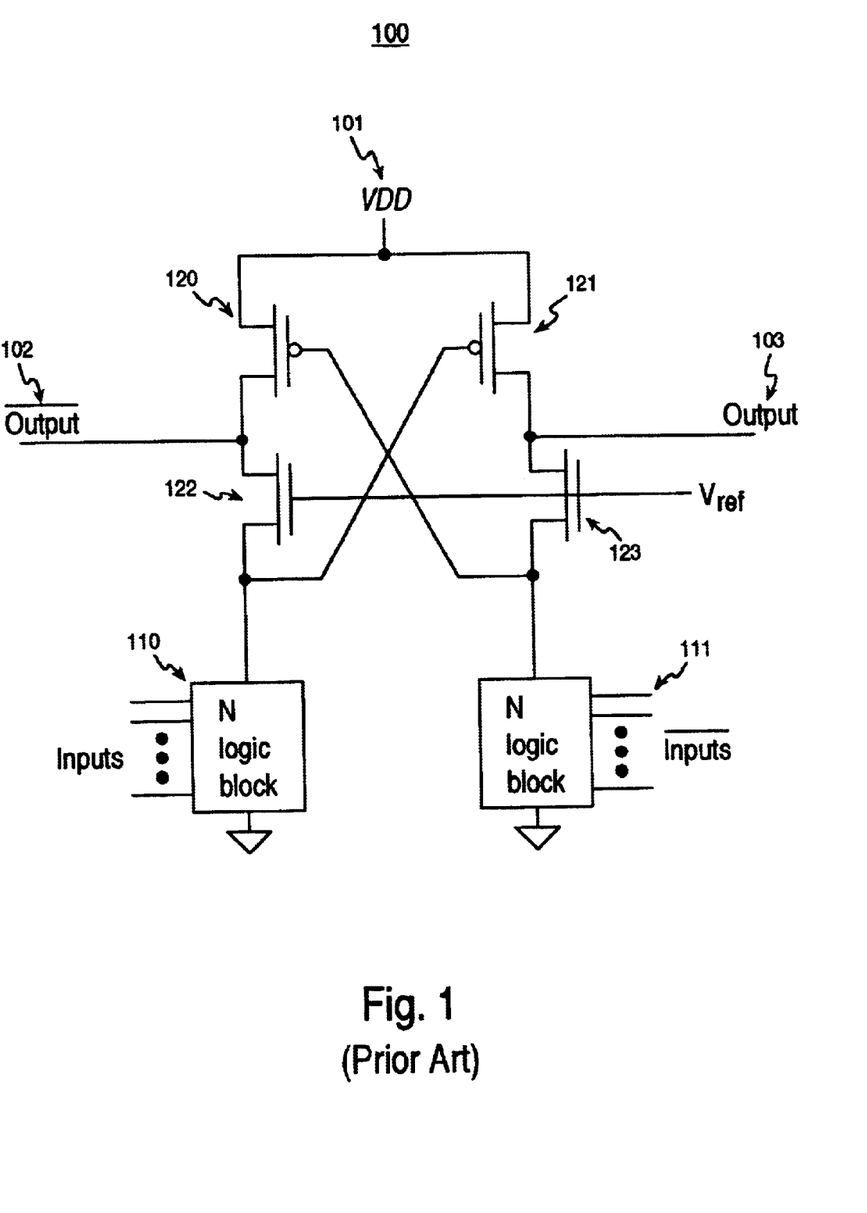
FIG. 1 shows a schematic diagram of a typical prior art level shifter circuit.

Prior art FIG. 1 shows a schematic diagram of a typical prior art level shifter circuit 100. As depicted in FIG. 1, level shifter 100 includes digital logic 110 and 111 for accepting low voltage digital logic inputs (e.g., 5 V), as shown. Transistors 120–123 function by shifting the low voltage digital inputs to the high voltage level of VDD 101. The high voltage outputs are received (e.g., by external circuits) at output 102 and output 103.

During normal operation, level shifter 100 functions by switching transistors 121 and 120 on and off in accordance with the inputs received by the input logic 110 and 111. For example, when transistor 120 is on, transistor 121 is off, output 102 is at VDD and output 103 is at Vref, as determined by transistor 123. Thus, in a case where VDD is 20 volts, level shifter 100 shifts the low voltage (e.g., 5 V) logic inputs from logic 110 and 111 to the 20 volt level of VDD. The higher voltage level can be used to drive external devices, such as power amplifiers, electronic actuators, and the like.

However, there exists a problem when the required output level of output 102 and output 103 exceeds the breakdown voltage of transistors 120 and 121. As described above, transistors 120 and 121 are used to switch the high voltage of VDD onto output 102 and 103 in accordance with the low voltage inputs 110 and 111. Transistors 120 and 121 are typically implemented as large PMOS transistors. Transistors 120 and 121 are off when the voltage applied to their gates is high (e.g., greater than 1.5 V). When VDD is high, for example, 40 V or higher, the voltage across the gates of transistors 120 and 121 exceeds their breakdown voltage. In such a case, transistors 120 and 121 will not be able to stop current flowing from VDD to outputs 102 and 103, and the circuit 100 will not function (and could be destroyed). A typical semiconductor fabrication process, the breakdown voltage is typically 30 V. Thus, conventional semiconductor fabrication technology cannot be used to implement level shifters when the output voltage level exceeds the breakdown voltage of the switching transistors.

Prior art attempts to solve this problem typically involve "cascading" together a number of level shifter circuit stages in order to incrementally build up the output level to that required by the external circuits (e.g., 40 V or higher). Other prior art attempts involved to use of current limiters In attempt to limit the Vgs seen by the main switching transistors. These prior art solutions were unsatisfactory due to the fact that they greatly increased the number of components required, and thus the size of the level shifter circuit. Additionally, these prior art solutions tended to require a constant current path to ground, wherein even during periods of inactivity, with no switching, power is dissipated by the circuit. This constant power dissipation made such circuits inappropriate for heat sensitive or battery-powered devices.

Thus, what is required is a solution capable of providing high voltage level outputs to drive external circuits or external devices. What is required is a compact, low component count circuit which can shift low voltage digital logic inputs to high voltage outputs. The required circuit should not require a constant current path to ground and should not dissipate current during periods of inactivity. The required solution should be compatible with widely used CMOS fabrication processes. The present invention provides a novel solution to these requirements.

SUMMARY OF THE INVENTION

The present invention provides a solution capable of providing high voltage level outputs to drive external circuits or external devices. The embodiments of the present invention are directed towards a compact, low component count circuit which can shift low voltage digital logic inputs to high voltage outputs. The circuit of the present invention does not require a constant current path to ground and does not dissipate current during periods of inactivity. Additionally, the circuit of the present invention is compatible with widely used CMOS fabrication processes.

In one embodiment, the present invention is implemented as a level shifter circuit for accepting low voltage inputs and providing high voltage outputs corresponding thereto. The level shifter circuit uses a reference voltage source configured to produce an intermediate voltage with respect to ground and a high voltage source. A first output transistor and a second output transistor are used for producing a high voltage swing output signal by using a high voltage source. Source follower transistors are used to switch on and switch off the first and second output transistors by using the intermediate voltage. The source follower transistors are configured to ensure the maximum voltage seen across the gates of the first and second output transistors is limited to a difference between the intermediate voltage and the high voltage source.

A differential input buffer can be used for controlling the source follower transistors in accordance with a low voltage differential input. The differential input buffer is configured to control the source follower transistors without requiring a static current. The differential input buffer can be configured to accept 5 volt logic differential input or lower. The difference between the intermediate voltage and the high voltage source, comprising the maximum voltage seen across the gates of the output transistors, is 30 volts or less. The high voltage source can be 50 volts or more and the high voltage swing output signal can have an output swing of 50 volts or more. The source follower transistors are PMOS source follower transistors. All the components of the level shifter circuit are compatible with widely used CMOS fabrication processes.

In this manner, the level shifter circuit of the present invention provides high voltage level outputs (e.g., 50 volts or greater) to drive external circuits or external devices (e.g., cathode ray tubes, plasma display panels, and the like). The level shifter circuit is compact, having low component count, and does not dissipate current during periods of inactivity.

BRIEF DESCRIPTION OF THE DRAWINGS

The present invention is illustrated by way of example and not by way of limitation, in the Figures of the accompanying drawings and in which like reference numerals refer to similar elements and in which.

Prior art

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The embodiments of the present invention are directed towards a method and system for a CMOS level shifter circuit for converting a low voltage input to a very high voltage output. The present invention provides a solution capable of providing high voltage level outputs to drive external circuits or external devices. The embodiments of the present invention are directed towards a compact, low component count circuit which can shift low voltage digital logic inputs to high voltage outputs. The circuit of the present invention does not require a constant current path to ground and does not dissipate current during periods of inactivity. Additionally, the circuit of the present invention is compatible with widely used CMOS fabrication processes. Embodiments of the present invention and their benefits are further described below.

Figure 2:
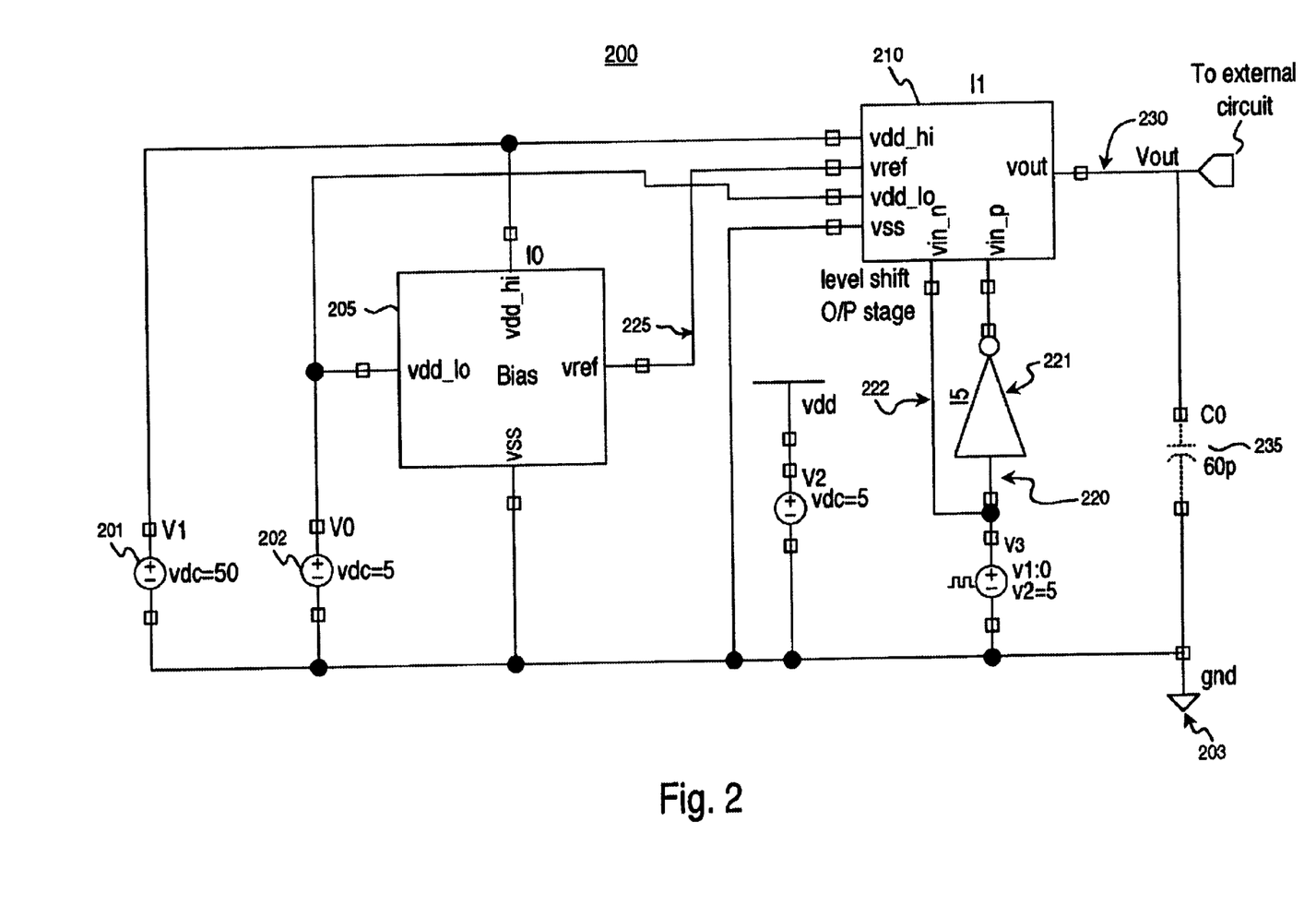
FIG. 2 shows a diagram of a level shifter circuit in accordance with one embodiment of the present invention.

FIG. 2 shows a diagram of a level shifter circuit 200 in accordance with one embodiment of the present invention. As shown in FIG. 2, level shifter circuit 200 has two main components, a reference voltage source 205, and an output generator 210. A high voltage source 201 and a low voltage source 202 are shown with respect to ground 203. An input signal is shown at node 220 which is converted to a differential input 221 and 222. A high voltage swing output signal is shown as Vout 230. The reference voltage source 205 produces an intermediate voltage Vref 225. The high voltage swing output signal 230 drives an external capacitance 235 of an external circuit.

The level shifter circuit 200 of the present embodiment functions by accepting low voltage inputs 221–222 and providing high voltage swing output signal 230 corresponding thereto. The level shifter circuit 200 uses the reference voltage source 205 to produce an intermediate voltage 225 with respect to ground 203 and the high voltage source 201. In this embodiment, the high voltage source 201 is 50 volts, the low voltage source swings from zero to 5 volts, and high voltage swing output signal 230 swings from zero to 50 volts.

The inputs to the reference voltage source 205 are as shown (e.g., the low voltage source 202, the high voltage source 201, and ground 203). The output of the reference voltage source 205 is the intermediate voltage Vref 225. The inputs to the output generator 210 are as shown (e.g., the low voltage source 202, the high voltage source 201, ground 203, the intermediate voltage Vref 225, and the differential inputs 221–222). The output of the output generator 210 is a high voltage swing output signal Vout 230.

Figure 3:
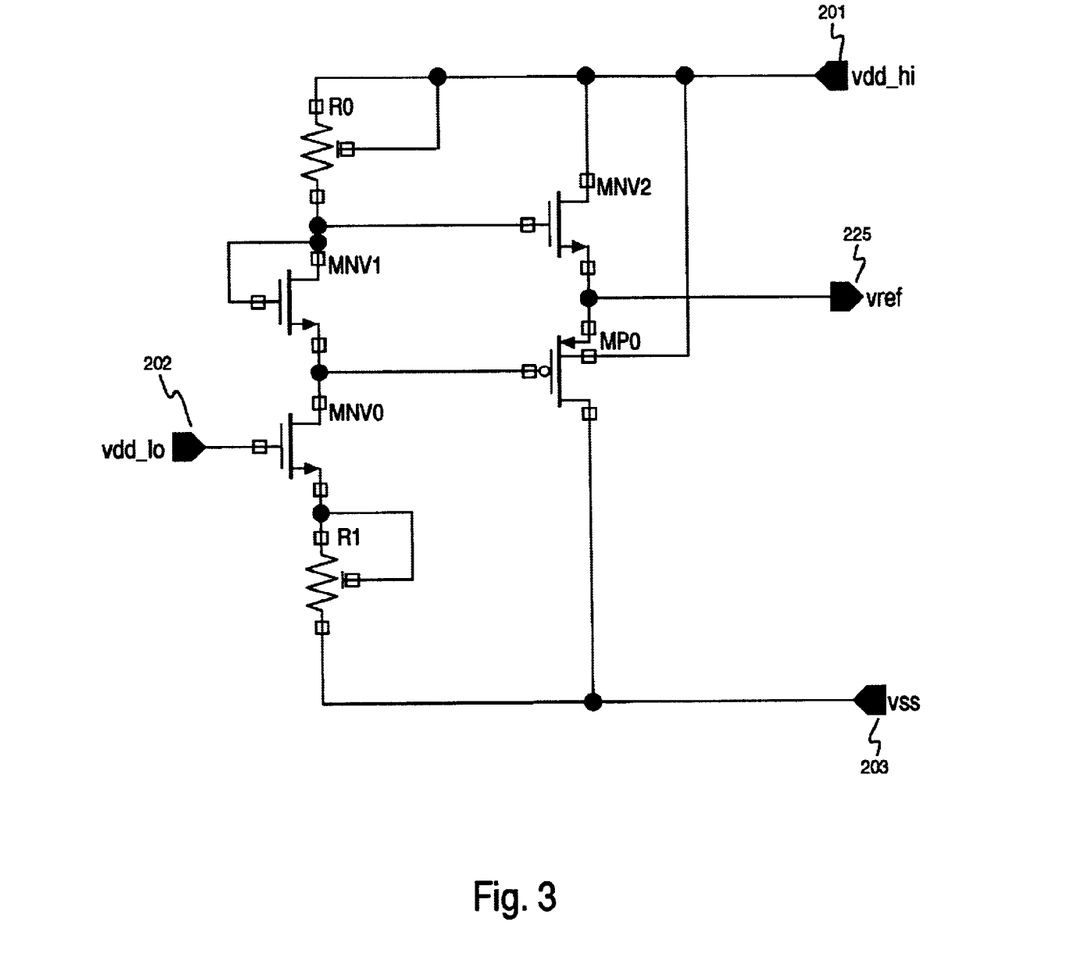
FIG. 3 shows a diagram of the components of a reference voltage source in accordance with one embodiment of the present invention.

FIG. 3 shows a diagram of the components of the reference voltage source 205. As described above, the reference voltage source 205 functions by producing an intermediate voltage Vref 225 for use by the output generator 210. The transistors MNV1 and MNV0 function with resistors R0 and R1 to set the level of the intermediate voltage 225. The level of the intermediate voltage 225 is basically governed by the ratio of resistors R0 and R1. Transistors MNV2 and MP0 function as "push-pull" transistors to insulate the intermediate voltage 225 from voltage transients (e.g., noise spikes, transients on the Vdd, and the like). In this embodiment, reference voltage source 205 produces an intermediate voltage 225 of 35 volts, or approximately 15 volts less than the high voltage source 201. This intermediate voltage 225 is used to protect the output transistors of output generator 210 from excessive Vgs voltages.

Figure 4:
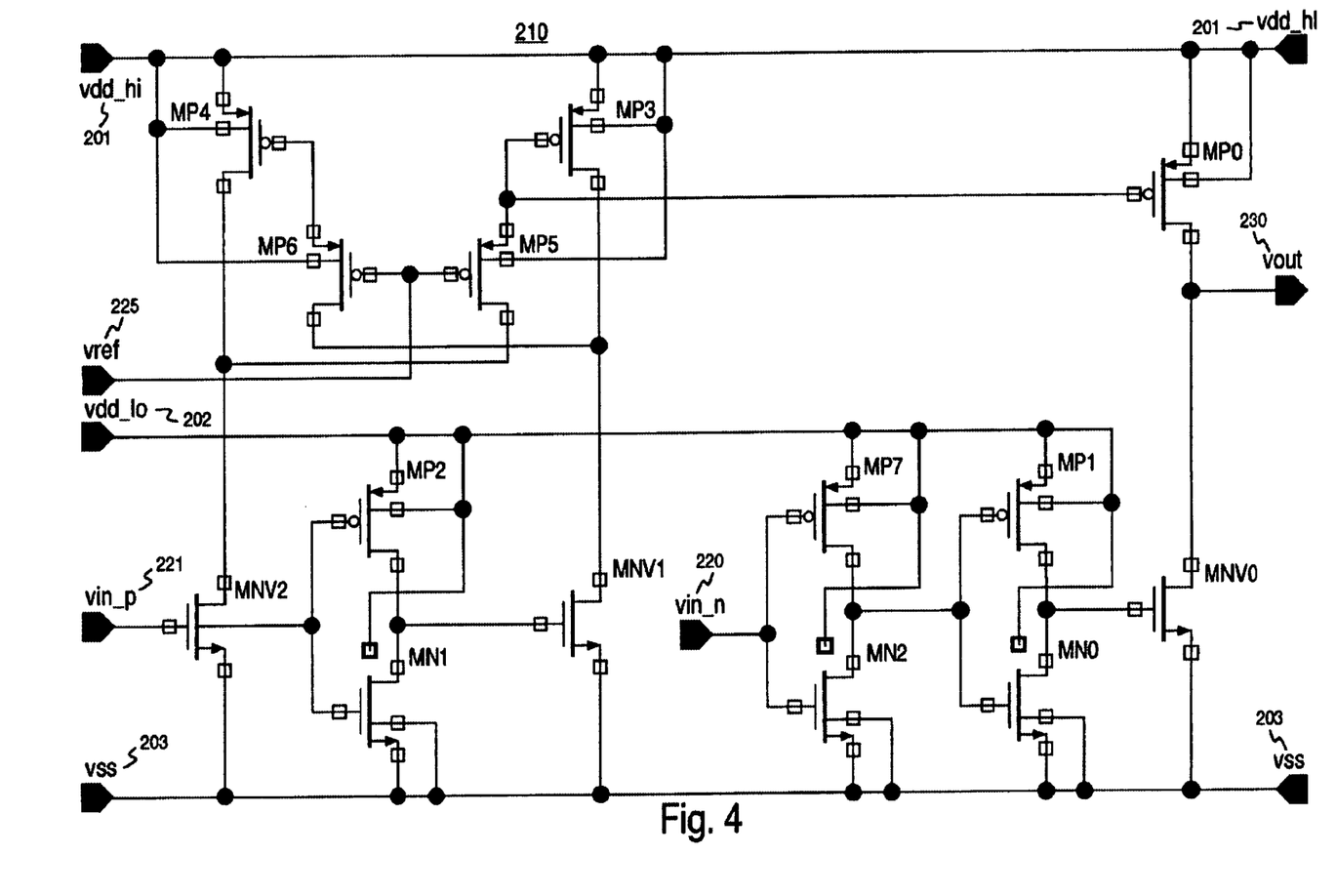
FIG. 4 shows a diagram of the components of an output generator in accordance with one embodiment of the present invention.

FIG. 4 shows a diagram of the components of the output generator 210. As described above, the output generator 210 functions by producing a high voltage swing output signal 230 in accordance with a low voltage digital differential input signal 220–221.

The output generator 210 includes a first output transistor MP0 and a second output transistor MNV0 for producing the high voltage swing output signal 230 by using the high voltage source 201. The output transistors MP0 and MNV0 are configured to be "extrawide" transistors in order to deliver high output currents. The high output currents drive the parasitic capacitance (e.g., parasitic capacitance 235 of FIG. 2) of any coupled external circuit. The output transistors MP0 and MNV0 comprise the output stage of the output generator 210.

In the present embodiment, a first and a second source follower transistor MP6 and MP5 are used to switch on and switch off the first and second output transistors MP0 and MNV0 by using the intermediate voltage 225 in conjunction with the differential input signal 220–221. The source follower transistors MP5 and MP6 are PMOS source follower transistors. The source follower transistors MP5 and MP6 are configured to ensure the maximum voltage seen across the gates of the first and second output transistors MP0 and MNV0 is limited to a difference between the intermediate voltage 225 and the high voltage source 201. In this embodiment, the difference between the intermediate voltage and the high voltage source, comprising the maximum voltage seen across the gates of the output transistors, is 15 volts. Thus, the Vgs of transistors MP4 and MP3 reaches a maximum of 15 volts, plus the threshold voltage of source follower transistors MP5 and MP6 (e.g., 0.5 V). Accordingly, the Vgs of the output transistor MP0 reaches a maximum of 15.5 volts. This Vgs is well below the breakdown voltage of the output transistor MP0. The source follower transistors MP5 and MP6, and transistors MP4 and MP3 comprise a source follower transistor stage of output generator 210.

Referring still to output generator 210 of FIG. 4, the differential input signals 220–221 are coupled to differential input buffers comprising transistors MNV2, MP2, MN1 and MNV1 for input 221, and transistors MP7, MN2, MP1, and MN0 for input 220. The differential input buffers function by controlling the source follower transistors MP6 and MP5 in accordance with the low voltage differential input 220–221. Additionally, in the present embodiment, the differential input buffers are configured to control source follower transistors MP5 and MP6 without requiring a standby current. In other words, there is no current flow to ground 203 when there is no switching activity, thus there is no static current.

In the present embodiment, the differential input buffers are configured to accept 5 volt logic differential input or lower. For example, in some applications, highly integrated digital logic is designed to function at reduced voltage levels of 3.3 V or less. The differential input buffer configuration of the present embodiment is well suited to handle such low voltage differential inputs.

It should be noted that although the differential input signal of the present embodiment swings from zero to 5 volts, and the high voltage swing output signal 230 swings from zero to 50 volts, the level shifter circuit of the present invention can be configured to operate with differential input differential input signals of 3.3 V or lower. Similarly, the high voltage source can be 50 volts or more and the high voltage swing output signal can have an output swing of 50 volts or more. The difference between the intermediate voltage and the high voltage source, comprising the maximum voltage seen across the gates of the output transistors, is maintained at no more than 30 volts, which is a typical breakdown voltage for CMOS transistors. Additionally, all the components of the level shifter circuit are compatible with widely used CMOS fabrication processes.

Thus, the level shifter circuit 200 of the present invention provides high voltage level outputs (e.g., 50 volts or greater) to drive external circuits or external devices (e.g., cathode ray tubes, plasma display panels, and the like). The level shifter circuit is compact, having low component count circuit, and does not dissipate current during periods of inactivity.

Figure 5:
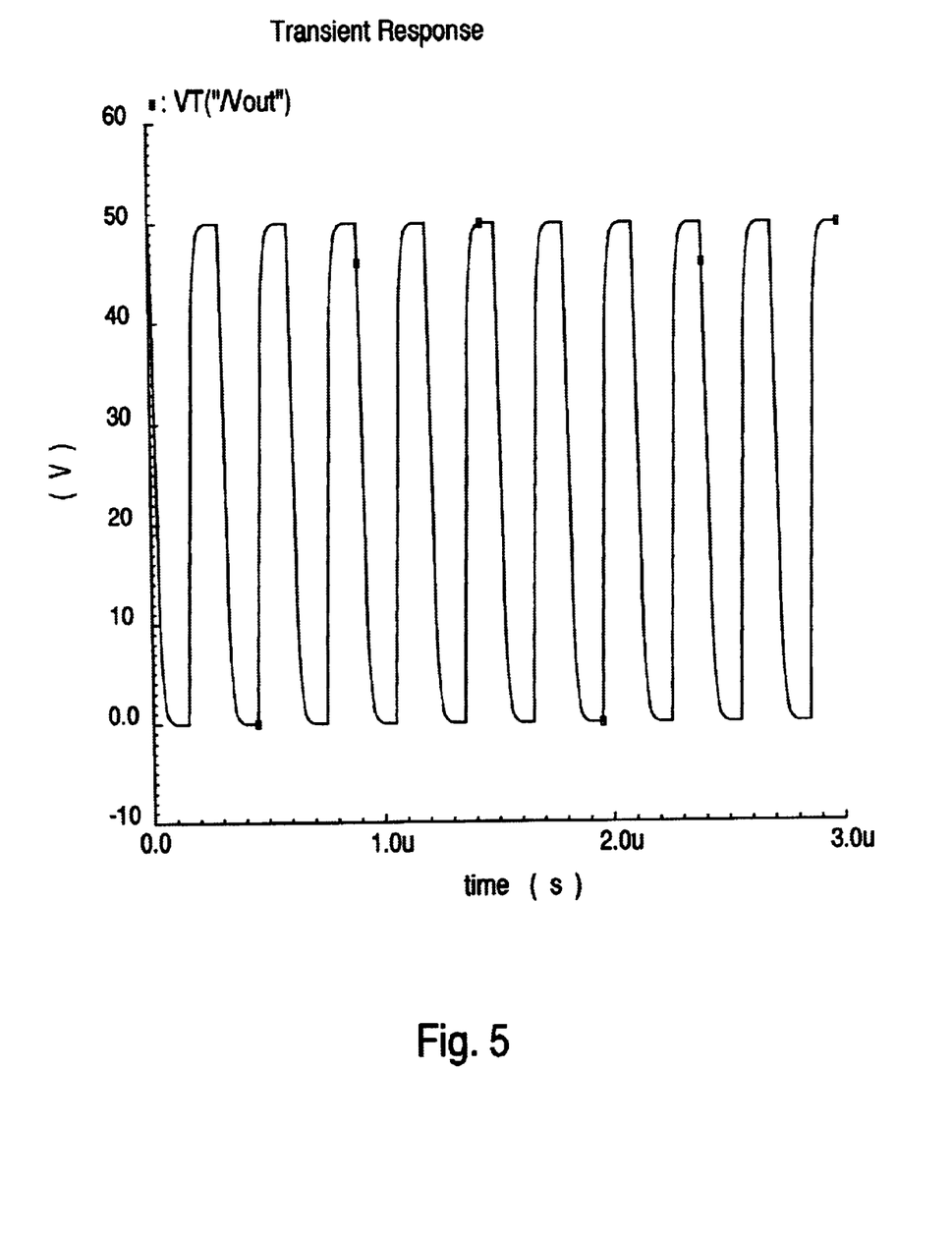
FIG. 5 shows a graph of the transient response of the output signal of the level shifter circuit in accordance with one embodiment of the present invention.

FIG. 5 shows a graph of the transient response of the output signal 230 of the level shifter circuit 200 in accordance with one embodiment of the present invention. The vertical axis of FIG. 5 shows the voltage of the high voltage swing output signal 230. The horizontal axis of FIG. 5 shows time. Thus, the output signal 230 swings from zero volts to 50 volts in accordance with the differential input 220–221.

Figure 6:
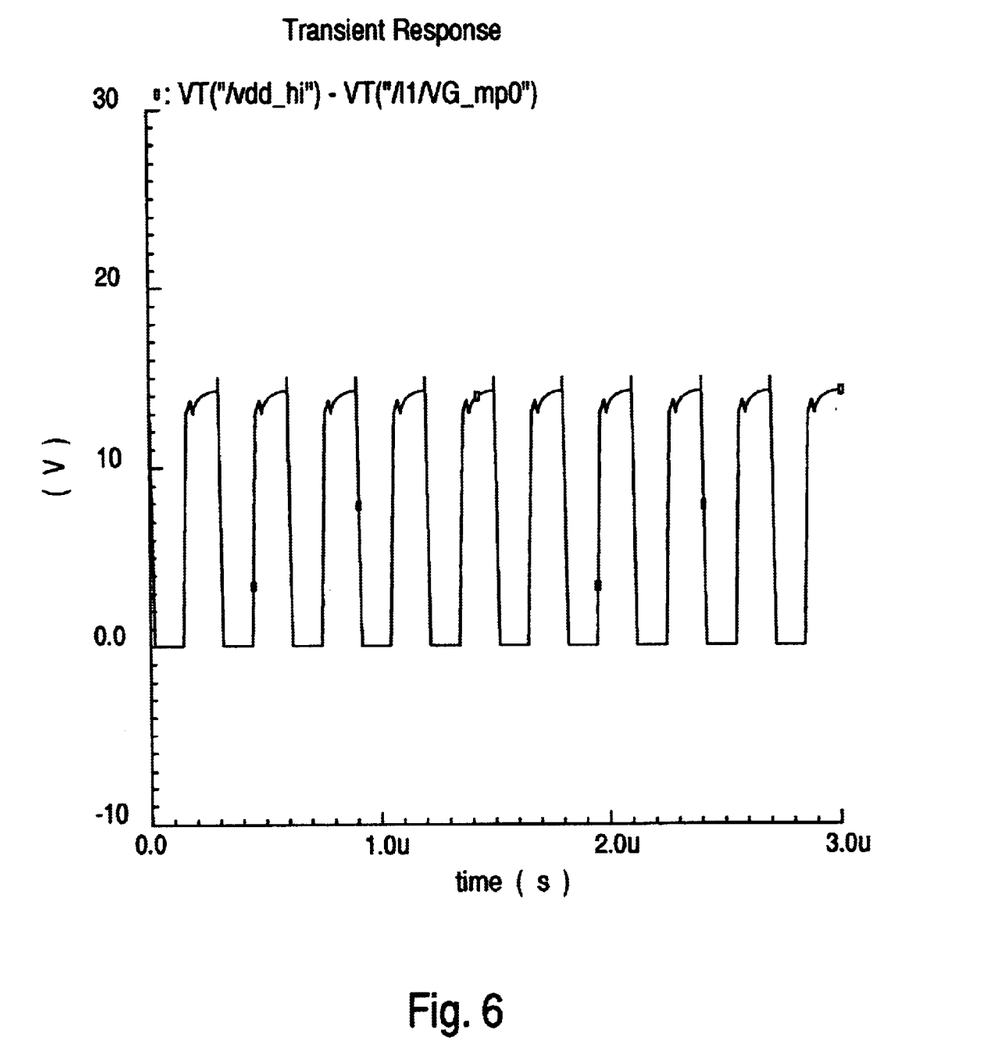
FIG. 6 shows a graph of the transient response of Vgs of an output transistor of the level shifter circuit in accordance with one embodiment of the present invention.

FIG. 6 shows a graph of the transient response of Vgs of output transistor MP0 of the level shifter circuit 200 in accordance with one embodiment of the present invention. The vertical axis of FIG. 6 shows the voltage of Vgs for transistor MP0. The horizontal axis of FIG. 6 shows time. Thus, the output signal 230 swings from zero volts to 50 volts as shown in FIG. 5, while the Vgs of the output transistor MP0 swings from zero volts to 15.5 volts in accordance with the differential input 220–221. As described above, this is well below the 30 volt breakdown voltage of MP0.

Figure 7:
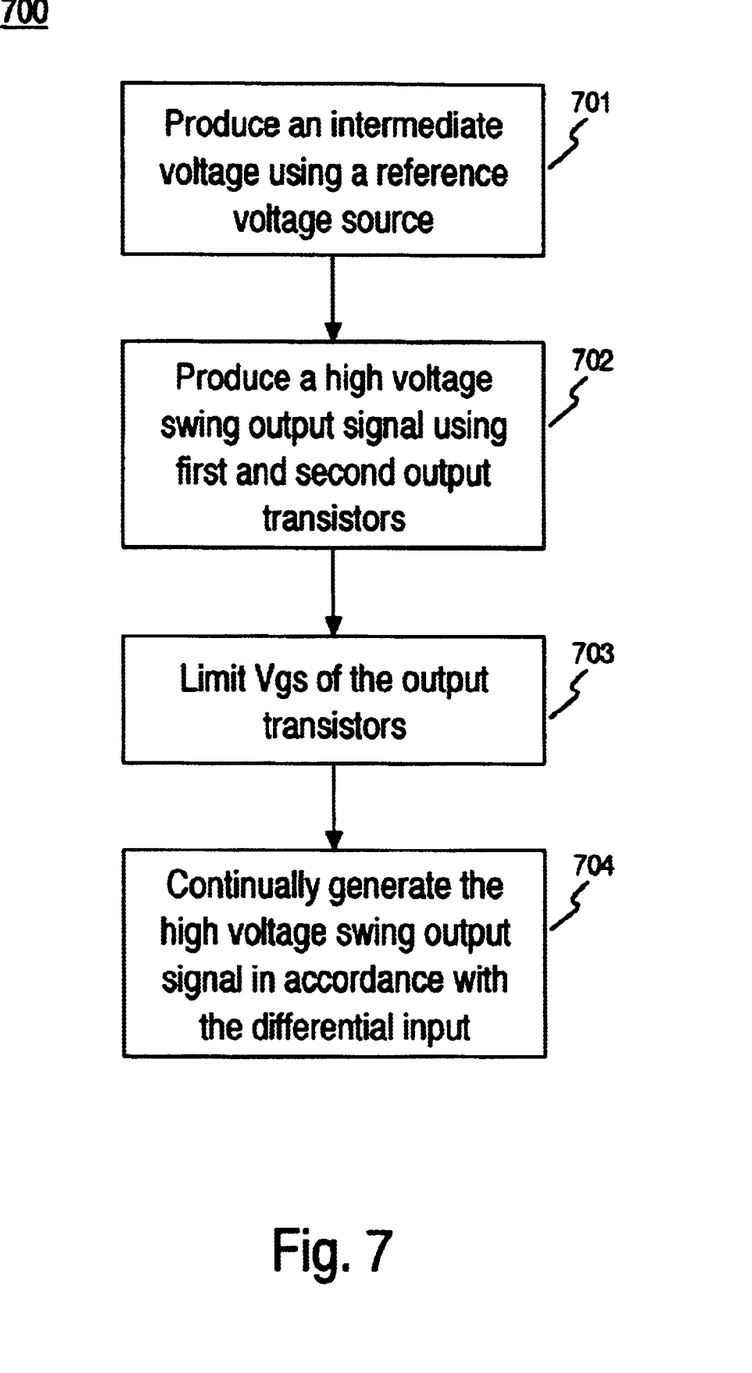
FIG. 7 shows a flowchart of the steps of an operating process of a level shifter circuit in accordance with one embodiment of the present invention.

FIG. 7 shows a flowchart of the steps of the operating process 700 of a level shifter circuit in accordance with one embodiment of the present invention. Process 700 shows the steps performed by a level shifter circuit when implementing a level shifter function for accepting low voltage inputs and providing high voltage outputs corresponding thereto.

In step 701, an intermediate voltage is produced by using a reference voltage source. As described above, a ratio between a first resistor and a second resistor is used to produce the intermediate voltage. In step 702, a high voltage swing output signal is produced by using a first output transistor and a second output transistor couple to a high voltage source. As described above, the output transistors are coupled to the high voltage source and use the high voltage source to generate the high voltage level of the output signal. In step 703, the maximum voltage seen across the gates of the first and second output transistors is limited to a difference between the intermediate voltage and the high voltage source. This accomplished by using source follower transistors configured to switch the first and second output transistors. As described above, the source follower transistors use the intermediate voltage to prevent Vgs of the output transistors from exceeding their breakdown voltage. In step 704, the high voltage swing output signal is continually generated in accordance with the low voltage differential input. As described above, differential input buffers can be used to accept the low voltage differential input (e.g., transistors MNV2, MP2, MN1 and MNV1 for input 221, and transistors MP7, MN2, MP1, and MN0 for input 220 comprise a differential input stage for output generator 210).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A level shifter circuit for accepting low voltage inputs and providing high voltage outputs corresponding thereto, comprising:

a reference voltage source configured to produce an intermediate voltage;

a first output transistor and a second output transistor for producing a high voltage swing output signal by using a high voltage source;

source follower transistors for switching on and switching off the first and second output transistors by using the intermediate voltage, the source follower transistors configured to ensure a maximum voltage across the gates of the first and second output transistors is limited to a difference between the intermediate voltage and the high voltage source; and a differential input buffer for controlling the source follower transistors in accordance with a low voltage differential input, the differential input buffer configured to control source follower transistors without requiring a standby current.

2. The level shifter circuit of claim 1 wherein the differential input buffer is configured to accept 5 volt logic differential input or lower.

3. The level shifter circuit of claim 1 wherein the differential input buffer is configured to accept 3.3 volt logic differential input or lower.

4. The level shifter circuit of claim 1 wherein the reference voltage source produces the intermediate voltage in accordance with a ratio between a first resistor and a second resistor.

5. The level shifter circuit of claim 1 wherein the first and second output transistors for producing the high voltage swing output signal are configured to produce high output current to drive parasitic capacitance on the high voltage swing output signal.

6. The level shifter circuit of claim 1 wherein the high voltage source is at least 50 volts and the high voltage swing output signal has an output swing of at least 50 volts.

7. The level shifter circuit of claim 1 wherein the difference between the intermediate voltage and the high voltage source, comprising the maximum voltage across the gates of the output transistors, is 30 volts or less.

8. The level shifter circuit of claim 1 wherein the source follower transistors are PMOS source follower transistors.

9. A CMOS level shifter circuit for accepting low voltage inputs and providing high voltage outputs corresponding thereto, comprising:

a reference voltage source configured to produce an intermediate voltage;

an output transistor stage couple to a high voltage source for producing a high voltage swing output signal by using the high voltage source;

a source follower transistor stage used to switch the output transistor stage by using the intermediate voltage, the source follower transistor stage configured to ensure a maximum voltage seen across gates of the output transistor stage is limited to a difference between the intermediate voltage and the high voltage source; and a differential input stage for controlling the source follower transistor stage in accordance with a low voltage differential input, the differential input stage configured to control the source follower transistors without requiring a standby current.

10. The level shifter circuit of claim 9 wherein the differential input stage is configured to accept 5 volt logic differential input or lower.

11. The level shifter circuit of claim 10 wherein the differential input stage is configured to accept 3.3 volt logic differential input or lower.

12. The level shifter circuit of claim 9 wherein the reference voltage source produces the intermediate voltage in accordance with a ratio between a first resistor and a second resistor.

13. The level shifter circuit of claim 9 wherein the high voltage source is at least 50 volts and the high voltage swing output signal has an output swing of 50 volts.

14. The level shifter circuit of claim 9 wherein the difference between the intermediate voltage and the high voltage source is 30 volts or less.

15. A method for implementing a level shifter function for accepting low voltage inputs and providing high voltage outputs corresponding thereto, comprising:

producing an intermediate voltage by using a reference voltage source;

producing a high voltage swing output signal by using a first output transistor and a second output transistor couple to a high voltage source;

limiting the maximum voltage seen across the gates of the first and second output transistors to a difference between the intermediate voltage and the high voltage source by using source follower transistors configured to switch the first and second output transistors; and controlling the source follower transistors in accordance with a low voltage differential input by using a differential input buffer configured to control the source follower transistors without requiring a standby current.

16. The method of claim 15 wherein the differential input buffer is configured to accept a 5 volt logic differential input or lower.

17. The method of claim 15 wherein the high voltage source is at least 50 volts and the high voltage swing output signal has an output swing of at least 50 volts.

18. The method of claim 15 wherein the difference between the intermediate voltage and the high voltage source, comprising the maximum voltage seen across the gates of the output transistors, is 30 volts or less.

* * * * *